(12) United States Patent
Roy

(10) Patent No.: US 7,736,932 B2
(45) Date of Patent: Jun. 15, 2010

(54) METHOD OF MANUFACTURING SENSOR WITH PHOTODIODE AND CHARGE TRANSFER TRANSISTOR

(75) Inventor: Francois Roy, Seyssins (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 11/960,024

(22) Filed: Dec. 19, 2007

(65) Prior Publication Data
US 2008/0149968 A1 Jun. 26, 2008

(30) Foreign Application Priority Data
Dec. 20, 2006 (FR) .................................... 06 11097

(51) Int. Cl.
*H01L 21/00* (2006.01)
*H01L 31/00* (2006.01)

(52) U.S. Cl. ..................... 438/57; 438/59; 438/144; 438/439; 257/225; 257/E21.001; 257/E31.001

(58) Field of Classification Search ............... 438/144, 438/199, 225, 439, 449, 493, 237, 215, 369, 438/60, 59, 57, 48; 257/215, 369, 225, E21.001, 257/E31.001
See application file for complete search history.

(56) References Cited

U.S. PATENT DOCUMENTS

| | | | | |
|---|---|---|---|---|
| 5,439,836 | A * | 8/1995 | Giffard | 438/151 |
| 5,489,792 | A * | 2/1996 | Hu et al. | 257/347 |
| 6,403,998 | B1 | 6/2002 | Inoue | |
| 7,084,443 | B2 * | 8/2006 | Kitano et al. | 257/291 |
| 2005/0088556 | A1 | 4/2005 | Han | |
| 2006/0124976 | A1 * | 6/2006 | Adkisson et al. | 257/292 |
| 2006/0145203 | A1 | 7/2006 | Toros et al. | |

OTHER PUBLICATIONS

FR Search Report; FR 0611097; Aug. 3, 2007.
* cited by examiner

*Primary Examiner*—Matthew Smith
*Assistant Examiner*—Michele Fan
(74) *Attorney, Agent, or Firm*—Hogan & Hartson LLP

(57) ABSTRACT

A method of manufacturing a photodiode sensor and an associated charge transfer transistor includes forming an insulation region on a substrate, forming the diode on a first side of the insulation region with the diode being self-aligned on the insulation region, and replacing the insulation region by a gate of the charge transfer transistor. The invention has particular utility in the manufacture of CMOS or CCD image sensors.

18 Claims, 3 Drawing Sheets

METHOD OF MANUFACTURING SENSOR WITH PHOTODIODE AND CHARGE TRANSFER TRANSISTOR

RELATED APPLICATION

The present application claims priority of French Patent Application No. 0611097 filed Dec. 20, 2006, entitled Procédé de Fabrication d'un Capteur Comprenant une Photodiode et un Transistor de Transfert de Charges, which is incorporated herein in its entirety by this reference.

FIELD OF THE INVENTION

The invention relates to a method for manufacturing a sensor comprising a photodiode and an associated charge transfer transistor. The method of the invention relates especially to the making of such a sensor by means of MOS technology. The invention can be applied advantageously in the making of CMOS or CCD image sensors.

BACKGROUND OF THE INVENTION

A sensor is described, for example, in D1 (U.S. Publication No. 2006/0124976) and is shown in FIG. 1. The sensor of D1 is made on a P− type substrate 100 and comprises a gate 102, a pinning layer 106 strongly doped with P+ type impurities, an accumulation region 108 doped with N type impurities and situated beneath the region 106, a read region 110 strongly doped with N type impurities. The length of the read region 110 is bounded on one side by the gate 102 and on the other side by an insulating border 112; the region 110 forms a floating drain of the transistor. The regions 106, 108 are bounded on one side by an insulating border 114 and on another side by the gate 102; the regions 106, 108 form two PN junctions of the photodiode with the substrate 100. The accumulation region 108 forms both the volume channel of the photodiode and the source of the transistor.

The working of such a sensor includes an accumulation phase and a transfer phase. During the accumulation phase, a ground potential is applied to the substrate 100 and to the pinning layer 106 and a reverse bias potential Vd is applied to the accumulation region 108; when photons strike an upper surface 118 of the diode, electron-hole pairs are generated in the diode, in the regions 108, 106 and 100 and the electrons are stored here in the N region 108. During the transfer phase, the gate 102 of the transfer transistor is turned on, a surface transfer channel is created beneath the gate 102 and the electrons generated by photoemission in the region 108 are transferred to the read region 110 whose content can then be read by appropriate read means (not shown in FIG. 1).

The depths of the regions 106,108 and the concentrations in N, P dopant of these regions are chosen so that, when the potential Vp is applied to the region 108, the space charge zones of the two PN junctions of the diode meet. Thus, during the accumulation phase, no majority carrier can be extracted from the region 108. Such a diode is called a pinned diode or a fully depleted diode.

In photodiode sensors, there often arises a problem of remanence due to a poor transfer of charges. This is due to the difference in position between the channel in volume of the photodiode (region 108) and the surface channel of the transistor situated beneath the gate of the transistor.

In the document D1, this problem is limited by making a gate 102 that is buried so that the transfer channel beneath the gate is in contact with the accumulation zone 108. The transfer of the charges is thus facilitated because the charges do not need to go in transit through the pinning zone 108.

However, the sensor of D1 is difficult to make. The different implantations of dopant impurities and the making of the gate indeed require the use of different masks, and this leads to an imprecise definition of the different regions or an encroachment by one region on the other or an encroachment by an implantation region on the gate.

SUMMARY OF THE INVENTION

The invention relates to a method of manufacturing a photodiode sensor and charge transfer transistor that do not show the above drawback.

In a preferred embodiment, a method of the present invention includes the following steps:

E1: forming an insulation region (214) on a substrate (200), with the insulation region (214) preferably being a thick oxide region obtained by a LOCOS method. A E2: forming the diode on a first (left) side of the insulation region (214), the diode being self-aligned on the insulation region (214), E3: replacing the insulation region (214) by a gate (226) of the transfer transistor.

Thus, in the method of the invention, it is planned first of all to make an insulation region which will then serve to define the different regions of the diode with precision without using an implantation mask whose boundaries have little precision.

After the diode has been made, the insulation region is replaced by the gate of the transistor. The buried part of the gate is thus defined with precision relative to the different regions of the diode without using a mask.

The step E1 for forming the insulation region may according to a LOCOS method comprise the following steps:

E11: depositing an oxide layer (202)

E12: depositing a first mask (210) having a first window (208),

E15: oxidation of a part of the silicon substrate situated beneath the oxide layer (202) and localized in the first window (208) to form the insulation region (214).

The method of the invention can also include a first implantation (step E13) of dopant impurities of a first type in the window (208) to form a first doped region (212) situated beneath the insulation region (214).

This first implantation thus enables a doping of the region of the substrate which will be situated in the end beneath the gate of the transistor, i.e. the channel region of the transistor. It is thus possible to adjust the threshold voltage of the transistor and, if necessary, provide for protection against disruption in volume of the transistor.

This first step of implantation of impurities is performed, for example, after the step E12 of deposition of the first mask and before the step E15 of localized oxidation. Thus, a same mask is used to define the first doped region and the future gate of the transistor, which are thus self-aligned relative to each other.

After formation of the insulation region, the diode-forming step E2 may comprise the following steps:

E22: second implantation of dopant impurities of the first type (P) to form a second doped region (218) extending from the first side of the insulation region.

E23: third implantation of dopant impurities of the second type (N) to form a third doped region (220) extending from the first side of the insulation region (212), and extending beneath the second doped region (218).

The second implantation and the third implantation may be self-aligned on the insulation region without the use of a mask defining the boundary of the insulation region. The insulation region itself protects the substrate situated beneath.

The step E2 also includes the following step E21 performed after the second implantation and the third implantation: E21: depositing a second mask (216) covering the substrate on a second side of the insulation region, opposite the first side, and partially covering the insulation region (214).

The second mask thus protects above all the substrate region adjacent to the insulation region and does not need to be defined with precision above the insulating zone, which is sufficient to protect the substrate situated beneath.

The step E3 for replacing the insulation region (214) by the gate (226) of the transfer transistor may include the following steps:

E33: removal of the insulation region by de-oxidation.

E34: depositing and etching a gate dielectric and a layer of gate material in the region previously covered by the insulation region.

Finally, the method may also include a step E4, performed after the step E2 or after the step E3, for the forming of a drain of the transistor (E4), self-aligned on a second side of the insulation region or the gate.

When the step E4 is performed after the step E2, the drain is self-aligned with the gate of the transistor.

The invention also relates to an image sensor comprising a photodiode sensor and a charge transfer transistor made according to the method described here above.

BRIEF DESCRIPTION OF THE DRAWINGS

The invention will be understood more clearly and other features and advantages shall appear from the following description of an example of a method according to the invention. The description is made with reference to the appended drawing, wherein.

DETAILED DESCRIPTION OF PREFERRED EMBODIMENTS

Figure 1:
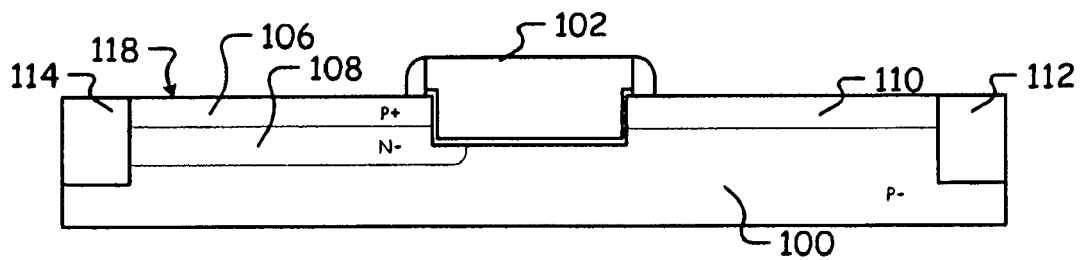
FIG. 1, already described, is a schematic sectional view of a prior-art sensor comprising a photodiode and an associated charge transfer transistor.

In the drawings, same references are used for same objects shown in several figures.

Here below, only the steps of the method pertaining to the invention shall be described. The method of the invention can furthermore be complemented by prior art steps not specific to the invention.

In the embodiment described here below, the sensor is made on a massive substrate that is weakly doped with impurities of the first type P. In other embodiments, the sensor may be made in a bulk with impurities of the first P type made in a substrate of the second N type. In other embodiments again, an epitaxially grown substrate is used, comprising a substrate doped with impurities of the first type P and comprising, on the surface, a P– weakly doped epitaxially grown layer in which the photodiode and the transistor are made, or else yet again an insulating substrate (using silicon-on-insulator or SOI technology for example) is made.

Again, in the embodiments described, the first type of dopant is the P type and the second type of dopant is the N type. However, the reverse is naturally possible.

The figures show sections along the axes (X, Z), of the transistor and of the diode according to the invention. The X, Y, Z axes are defined such that:

the upper surface of the substrate defines the plane (X, 0, Y), the width of the different regions of the substrate being defined along the Y axis, the length of the different regions being defined along the direction X, and the section of the different regions being defined in the (X, Y) plane, the Z axis extends perpendicularly to the upper surface of the substrate, from the upper surface of the substrate towards the lower surface of the substrate, the depth of the different regions of the substrate being defined along the Z axis and positively downwards, in the figures, the X axis extends horizontally from left to right, the Y axis extends perpendicularly rearwards (and is therefore not shown) and the Z axis extends vertically downwards.

The figures show only partial sections of the diode and of the transistor. The known parts of the sensor are not shown.

In particular, the active zones of the diode and of the drain of the transfer transistor are truncated. In practice, the diode is bounded at one end by an insulating border (not shown) and at another end by the insulation region 214 or the gate 226 of the transistor. In the same way, the drain of the transistor is bounded at one end by the insulation region 214 or the gate 226 of the transistor and at another end by the insulating border (not shown). The insulating border on the diode side and the insulating border on the transistor side are similar to the insulating borders 112,114 of FIG. 1 and are made using a similar known method such as a method of shallow trench insulation (STI).

Again, the method of the invention could advantageously be complemented by known steps for making metal contacts needed for the electrical power supply of the different parts of the sensor.

In the embodiments described, the diode is made to the left of the transfer transistor; it extends from a first (left) side of the gate of the transfer transistor, between a first insulating border (not shown) and the gate. The transfer transistor for its part is to the right of the diode, which in practice forms the source of the transistor), the drain of the transistor extends from a second (right) side of the gate, between the gate and a second insulating border (not shown). The inverse configuration (with the diode to the right of the transistor) is naturally possible.

Figure 8:
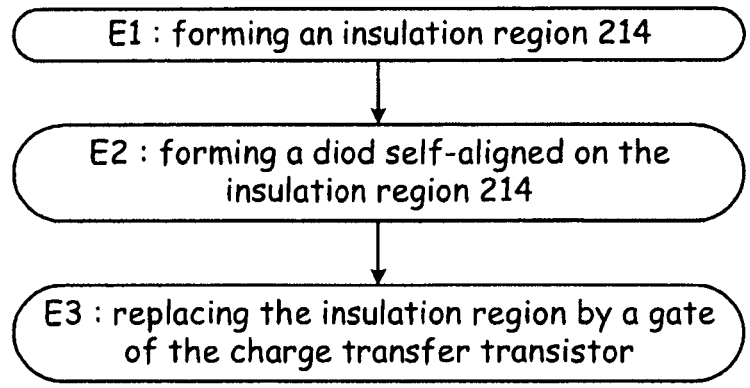
FIG. 8 illustrates the essential steps of the method of the invention, FIG. 9 provides a detailed view of certain steps of FIG. 8.
Figure 9:
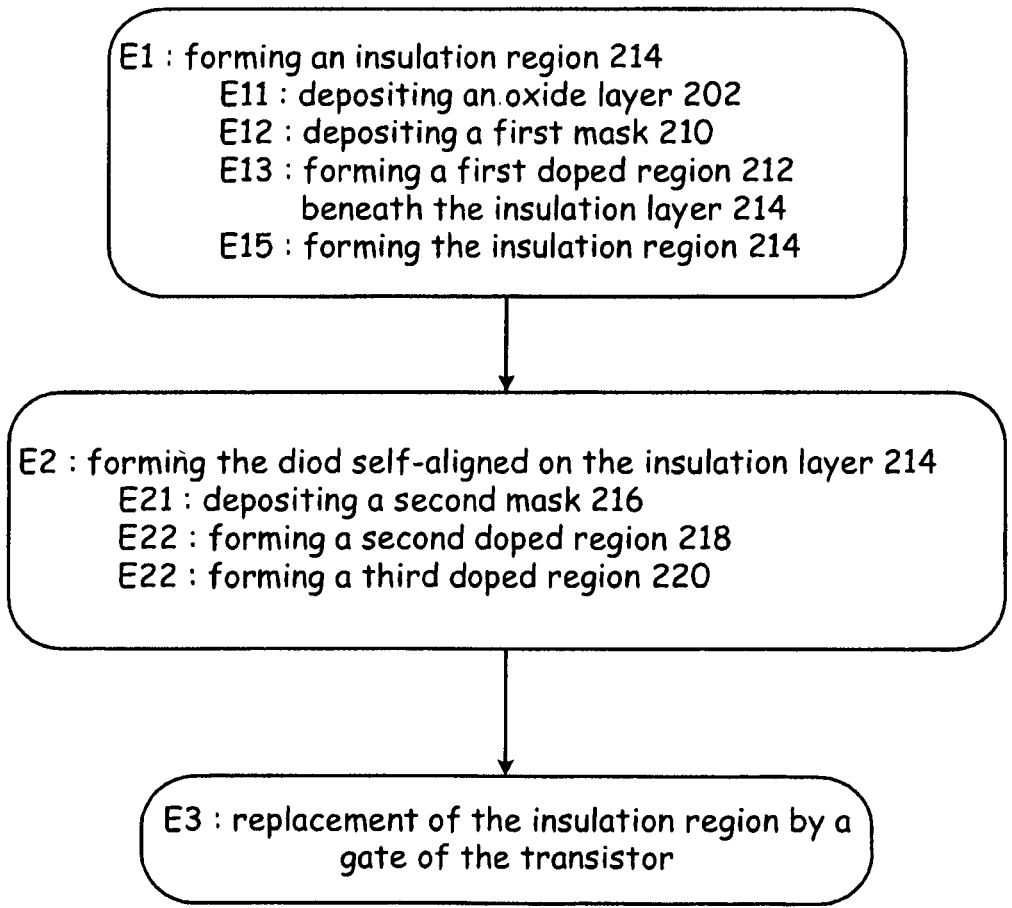

As stated here above, the method of the invention also comprises the following steps (FIG. 8):

E1: forming an insulation region 214 on a substrate, the insulation region (214) being a thick oxide region obtained by a LOCOS method, E2: forming the diode on a first side (shown to the left in the example) of the insulation region 214, the diode being self-aligned on the insulation region 214, E3: replacing the insulation region 214 by a gate 226 of the transfer transistor.

Figure 2:
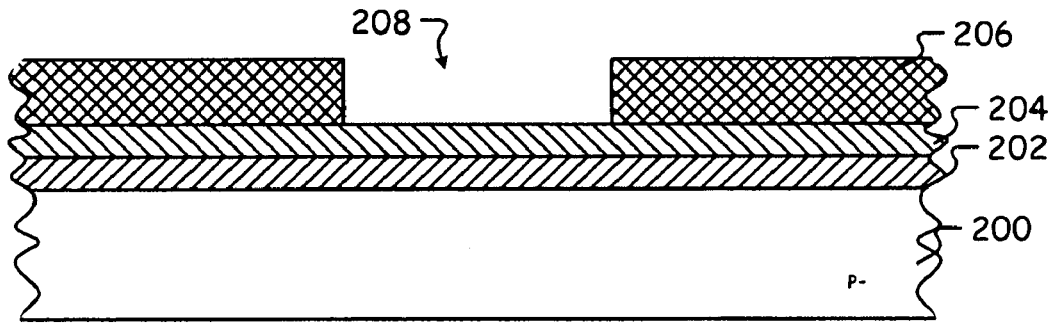
FIGS. 2 to 7 are schematic sectional views illustrating the steps of manufacture of a sensor according to the invention.
Figure 3:
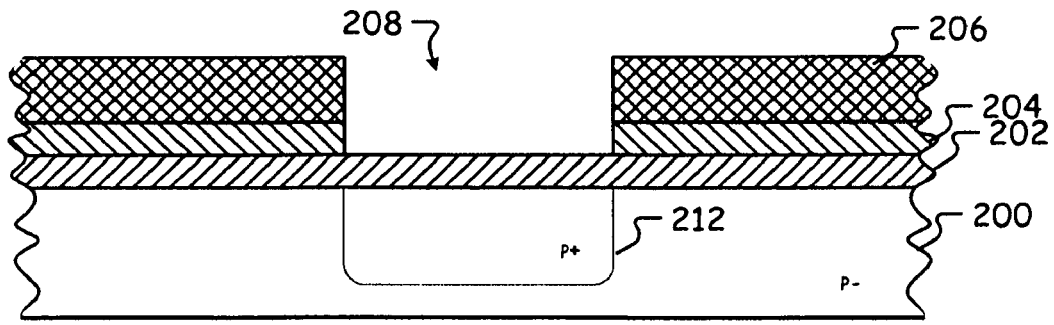
Figure 4:
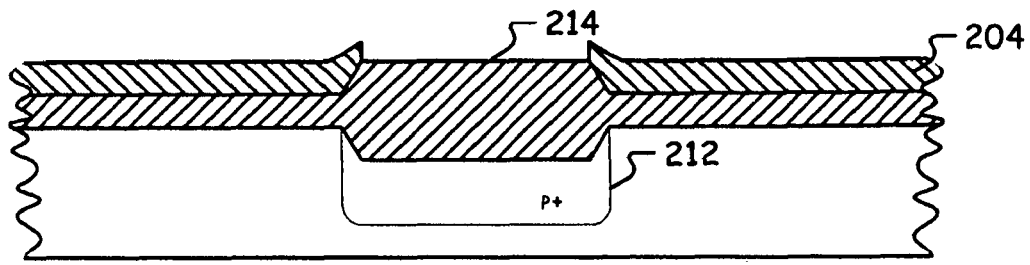

FIGS. 2 to 4 provide a detailed, exemplary view of an embodiment of the insulation region 214 made according to a LOCOS (Localized Oxidation of Silicon) type of method. The insulation region 214 is, in this case, formed (step E1) as follows.

An oxide layer 202 with a thickness of about 200 to 500 angströms is deposited (step E11) on the substrate 200.

A first mask 210, comprising a first nitride mask 204 and a first resin mask 206 and having a first window 208 is then deposited on the oxide layer 202 (step E12) as follows. A layer of nitride (such as silicon nitride $Si_3N_4$) 204, about 200 to 500 angströms, is then deposited (step E121) on the oxide 202. Then, the nitride layer 204 is covered (step 122) with a first resin mask 206 having the window 208. This is done in a known way by the depositing of a resin layer followed by an etching of the resin by photolithography. The nitride apparent in the window 208 is then eliminated (step 123) by a method of etching by photolithography for example. FIG. 2 shows the result of the step E12: the first mask 210 thus has a window 208 in a nitride layer 204 covered with a resin layer 206. The resin layer 206 is necessary firstly to define the substrate region to be doped to form the channel of the transistor and secondly to define (etch) the nitride mask. The nitride mask 204 for its part is necessary to define the localized oxidation region to form the insulation region 214 according to the LOCOS technique.

A first implantation of impurities of the first type P is then made in the window 208 (step E13), causing the appearance of a first strongly doped (P+) region 212 beneath the oxide layer 202, having a section similar to that of the window 208. The first region 212 forms the channel region of the transistor. The first implantation may include a surface implantation for adjustment of the threshold voltage of the transfer transistor (this implantation being also called a channel implantation) and, if necessary, an intermediate anti-disruption implantation to protect the transistor against a possible volume disruption). The first implantation is naturally aligned with the resin mask 206. FIG. 3 shows the result of the step E13 after a surface implantation and an intermediate implantation.

The first resin mask 206 is then removed.

Then, by means of heat treatment under oxidizing atmosphere, the part of the silicon substrate situated beneath the oxide layer 202 and localized in the first window 208 is oxidized to form the insulation region 214 according to the LOCOS technique (step E15).

The insulation region 214 is situated (FIG. 4) above the first region 212 implanted earlier during the step E12. The insulation region 214 is aligned with the first nitride mask 204.

Figure 5:
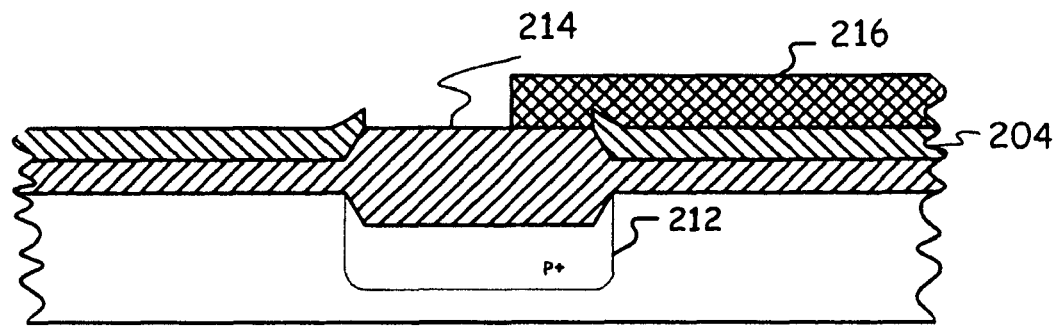

The first nitride mask 204 is then removed. In an alternative embodiment, as shown in FIG. 5, the first nitride mask 204 is not removed.

After the insulation region 214 has been formed (step E1), the diode is formed (step E2) as follows.

A second resin mask 216 is deposited (step E21, FIG. 5), partially overlapping the insulation region 214 and, above all, the substrate region adjacent to the insulation region 214 situated on the side opposite the diode (in the example shown, to the right of the diode). It must be noted that the precision with which the resin mask 216 is defined above the insulation region 214 is of little importance. The essential point is that the region of the substrate adjacent to the insulation region 214 and opposite the diode should be protected by the resin mask 216.

Then a second implantation is made (step E22) of impurities of the first type, bringing about the appearance of a second strongly doped (P+) region 218 on the first side (in this case to the left) of the insulation region 214. The impurities go through the thin oxide layer 202, but not the insulation region 214 which is far thicker. The second implantation is thus self-aligned on the insulation region 214, and is not dependent on the lack of precision of the definition of the mask 216. The second doped region 218 forms the pinning region of the diode. The region 218 extends from the first side of the region 214, between the region 214 and the insulating border (not shown) on the diode side and on a second fairly small depth (surface implantation).

Then a third implantation (step E23) is made of impurities of the second N type, bringing about the appearance of a third weakly doped (N) region 220 on the first side (in this case to the left) of the insulation region 214 and situated beneath the second doped region 218. The third implantation is self-aligned on the insulation region 214 for the same reason as the second implantation is self-aligned on the insulation region 214. The third doped region 220 forms the accumulation region of the diode. The region 220 extends from the first side (to the left) of the region 214, between the region 214 and the insulating border (not shown) on the diode side, beneath the region 218 and on a third fairly great depth (deep implantation).

The choice of the quantity of impurities and of the energy of implantation (which defines the implantation depth) for the different steps of implantation takes account especially of:
  threshold voltage of the transistor and protection against disruption, for the implantation of the region 212,
  "Pinning" property of the diode and contact between the accumulation region 220 of the diode and the channel 212 of the transistor for the implantation of the regions 218, 220.

After the diode has been formed (step E2), the insulation region 214 is replaced by the gate 226 of the transistor (step E3) as follows:

The insulation region 214 and also the oxide layer 202 is first of all removed (step E33) by a known technique of de-oxidation of the surface of the substrate.

Figure 6:
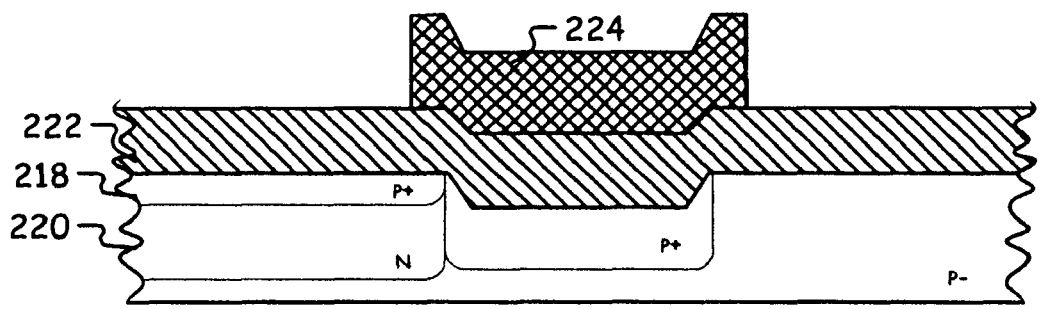
Figure 7:
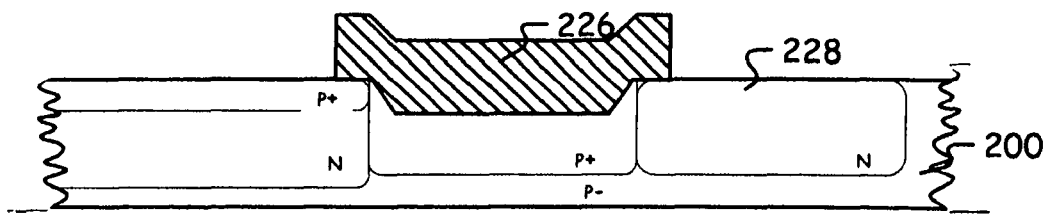

The gate 226 is then formed (step E34) by the depositing and etching of a gate dielectric and of a layer of gate material in the region earlier covered by the insulation region, for example as follows:
  growing of a thin oxide layer of SiO2 (not shown) by oxidation of the surface of the substrate,
  depositing of a layer of gate material 222 (for example a layer of polysilicon or any other appropriate material, or else a layer of insulator covered with a polysilicon layer) and then a layer of resin on the thin oxide layer
  etching of the resin layer (for example by photolithography) to keep only a third resin mask 224 situated above the first doped region 212 and above the space left free after removal of the insulation region 214 (FIG. 6),
  elimination of the gate dielectric layer and of the layer of gate material by photolithography at the places not covered by the third mask 224.
  elimination of the third resin mask 224 (FIG. 7).

The gate 226 thus formed can extend over a length slightly greater than the length of the insulation region 214 that it replaces, and thus encroach on the doped regions 218, 220 especially because of the lack of precision of the size of the mask 224. However, the precise definition of the gate has no effect on the transfer of the charges from the source 220 to the drain 228 of the transistor.

The method of the invention is complemented by a step E4 for the forming of a drain 228 of the transistor, on a second side of the insulation region 214 or of the gate 226. A step E4 comprises:
  The depositing of a fourth resin mask (not shown) which partially covers the insulation region 214 and above all the substrate region adjacent to the insulation region 214 and is situated on the diode side.
  A fourth implantation of impurities of the second N type, causing the appearance of a fourth (N) doped region 228 on the second side (here to the right) of the insulation region 214.

The fourth doped region 228 forms the drain of the transistor. The region 228 extends from the second side of the gate, between the gate and the insulating border (not shown) on the transistor side.

The step E4 can thus be performed after the step E3 for replacing the insulation region 214 by the gate 226.

The step E4 can also been done after the step E2, before the step E21 for depositing the second mask. In this case, the fourth implantation is self-aligned on the insulation region 214 for the same reason as the reason for which the second implantation is self-aligned on the insulation region 214.

While there have been described above the principles of the present invention in conjunction with specific implementations and device processing technology, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A method of manufacturing a photodiode sensor and an associated charge transfer transistor, the method comprising:
   forming an insulation region on a substrate, the insulation region being a thick oxide region obtained by a LOCOS method;
   forming the diode on a first side of the insulation region, the diode being self-aligned on the insulation region and generating electron-hole pairs when an upper surface thereof is struck by photons;
   replacing the insulation region by a gate of the charge transfer transistor; and
   forming a drain of the transistor, self-aligned on a second side of the insulation region or the gate,
   wherein the drain forming step is performed after the insulation region replacing step or after the diode forming step.

2. The method according to claim 1, wherein the insulation region forming step comprises:
   depositing an oxide layer;
   depositing a first mask having a first window; and
   oxidizing a part of the silicon substrate situated beneath the oxide layer and localized in the first window to form the insulation region.

3. The method according to claim 2, wherein the insulation region forming step further comprises:
   implanting a first implantation of dopant impurities of a first type in the first window to form a first doped region beneath the insulation region.

4. The method according to claim 2, wherein the diode-forming step further comprises:
   implanting a second implantation of dopant impurities of the first type to form a second doped region extending from the first side of the insulation region; and
   implanting a third implantation of dopant impurities of the second type to form a third dopant region extending from the first side of the insulation region and extending beneath the second doped region.

5. The method according to claim 4, wherein the diode forming step further comprises the following step, performed after the second implantation and the third implantation steps:
   depositing a second mask covering the substrate on a second side of the insulation region, opposite the first side, and partially covering the insulation region.

6. The method according to claim 5, wherein the insulation region replacing step comprises:
   removing the insulation region by de-oxidation; and
   depositing and etching a gate dielectric and a layer of gate material in the region previously covered by the insulation region.

7. The method of according to claim 1, wherein an upper portion of the diode has an opposite polarity type to a drain of the charge transfer transistor.

8. The method according to claim 7, wherein the insulation region forming step comprises:
   depositing an oxide layer;
   depositing a first mask having a first window; and
   oxidizing a part of the silicon substrate situated beneath the oxide layer and localized in the first window to form the insulation region.

9. The method according to claim 8, wherein the insulation region forming step further comprises:
   implanting a first implantation of dopant impurities of a first type in the first window to form a first doped region beneath the insulation region.

10. The method according to claim 7, wherein the diode-forming step further comprises:
    implanting a second implantation of dopant impurities of the first type to form a second doped region extending from the first side of the insulation region; and
    implanting a third implantation of dopant impurities of the second type to form a third dopant region extending from the first side of the insulation region and extending beneath the second doped region.

11. The method according to claim 10, wherein the diode forming step further comprises the following step, performed after the second implantation and the third implantation steps:
    depositing a second mask covering the substrate on a second side of the insulation region, opposite the first side, and partially covering the insulation region.

12. The method according to claim 7, wherein the insulation region replacing step comprises:
    removing the insulation region by de-oxidation; and
    depositing and etching a gate dielectric and a layer of gate material in the region previously covered by the insulation region.

13. The method according to claim 1, wherein the insulation region forming step further comprises:
    implanting a first implantation of dopant impurities of a first type in the window to form a first doped region beneath the insulation region.

14. The method according to claim 1, wherein the diode-forming step further comprises:
    implanting a second implantation of dopant impurities of the first type to form a second doped region extending from the first side of the insulation region; and
    implanting a third implantation of dopant impurities of the second type to form a third dopant region extending from the first side of the insulation region and extending beneath the second doped region.

15. The method according to claim 14, wherein the diode forming step further comprises the following step, performed after the second implantation and the third implantation steps:

depositing a second mask covering the substrate on a second side of the insulation region, opposite the first side, and partially covering the insulation region.

16. An image sensor comprising a photodiode sensor and charge transfer transistor made according to claim 15.

17. The method according to claim 1, wherein the insulation region replacing step comprises:

removing the insulation region by de-oxidation; and depositing and etching a gate dielectric and a layer of gate material in the region previously covered by the insulation region.

18. An image sensor comprising a photodiode sensor and charge transfer transistor made according to claim 1.

* * * * *